US012701942B2

(12) United States Patent
Kawai

(10) Patent No.: US 12,701,942 B2
(45) Date of Patent: Aug. 4, 2026

(54) WAFER PROCESSING APPARATUS PROVIDING CLEANING AND ETCHING UNITS WITH SEPARATE SHROUDS AND ENCLOSING SEPARATE SPINNER TABLES

(71) Applicant: DISCO CORPORATION, Tokyo (JP)

(72) Inventor: Akihito Kawai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 380 days.

(21) Appl. No.: 18/513,969

(22) Filed: Nov. 20, 2023

(65) Prior Publication Data

US 2024/0177999 A1     May 30, 2024

(30) Foreign Application Priority Data

Nov. 29, 2022     (JP) ................................. 2022-190007

(51) Int. Cl.
*H10P 52/00*          (2026.01)
*H10P 50/64*          (2026.01)
                        (Continued)

(52) U.S. Cl.
CPC ............ *H10P 52/00* (2026.01); *H10P 50/642* (2026.01); *H10P 52/402* (2026.01); *H10P 70/56* (2026.01);
                        (Continued)

(58) Field of Classification Search
CPC ........ H10P 52/00; H10P 52/40; H10P 52/402; H10P 72/0428; H10P 50/642;
                        (Continued)

(56) References Cited

U.S. PATENT DOCUMENTS

2019/0291240 A1     9/2019  Shibata et al.
2022/0274222 A1*    9/2022  Wakabayashi ............ B24B 7/04
                        (Continued)

FOREIGN PATENT DOCUMENTS

JP          2008042081 A      2/2008
JP          2008047695 A  *   2/2008  ....... H01L 21/30604
                        (Continued)

OTHER PUBLICATIONS

JP-2008047695—Machine Translation (Year: 2008).*
                        (Continued)

*Primary Examiner* — Younes Boulghassoul
(74) *Attorney, Agent, or Firm* — Greer Burns & Crain Ltd.

(57)                    ABSTRACT

A wafer processing apparatus includes a chuck table for holding the wafer thereon, a grinding unit having a rotatable grinding wheel with an annular array of grindstones mounted thereon for grinding a surface of the wafer, a cleaning unit for cleaning the wafer that has been ground, and an etching unit for removing a strain from the ground surface of the wafer. The grinding wheel is smaller in diameter than the wafer, enabling the grindstones mounted on the grinding wheel to thin down an inner region of the wafer that includes the ground surface, leaving an outer circumferential ring-shaped stiff portion on the wafer. The etching unit supplies an etching liquid to the inner region of the wafer inward of the outer circumferential ring-shaped stiff portion of the wafer for thereby removing a strain from the ground surface of the wafer.

9 Claims, 5 Drawing Sheets

(51) Int. Cl.

| | |
|---|---|
| *H10P 52/40* | (2026.01) |
| *H10P 70/00* | (2026.01) |
| *H10P 72/00* | (2026.01) |
| *H10P 72/70* | (2026.01) |
| *H10P 72/78* | (2026.01) |

(52) U.S. Cl.
CPC ...... *H10P 72/0414* (2026.01); *H10P 72/0424* (2026.01); *H10P 72/0428* (2026.01); *H10P 72/0451* (2026.01); *H10P 72/7402* (2026.01); *H10P 72/78* (2026.01); *H10P 72/7416* (2026.01)

(58) Field of Classification Search
CPC .. H10P 72/0414; H10P 72/0424; H10P 72/78; H10P 72/7402; H10P 70/56
See application file for complete search history.

(56) References Cited

U.S. PATENT DOCUMENTS

| | | | | |
|---|---|---|---|---|
| 2023/0321781 | A1* | 10/2023 | Tashino | .................... B24B 1/04 |
| 2025/0316506 | A1* | 10/2025 | Sakaguchi | .............. H10P 52/00 |

FOREIGN PATENT DOCUMENTS

| | | | | |
|---|---|---|---|---|
| JP | 2010109209 | A | | 5/2010 |
| JP | 2012169487 | A | | 9/2012 |
| JP | 2015054363 | A | * | 3/2015 |
| JP | 2017188549 | A | | 10/2017 |
| JP | 2018083253 | A | | 5/2018 |
| JP | 2019169513 | A | | 10/2019 |

OTHER PUBLICATIONS

JP-2015054363—Machine Translation (Year: 2015).*
Office Action issued by the German Patent Office DE Patent Application No. 10 2023 211 633.2, dated Jun. 6, 2025.
Office Action issued in counterpart Japanese patent application No. 2022-19007, dated Mar. 17, 2026.

* cited by examiner

FIG.4A
FIG.4B
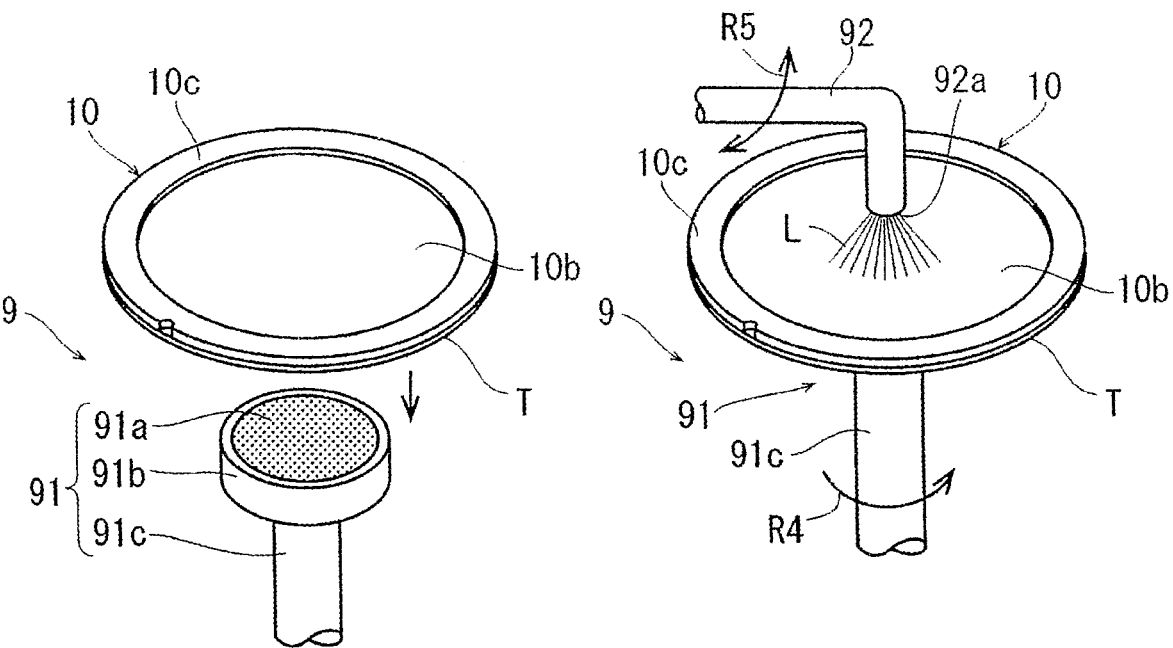
FIG.4C
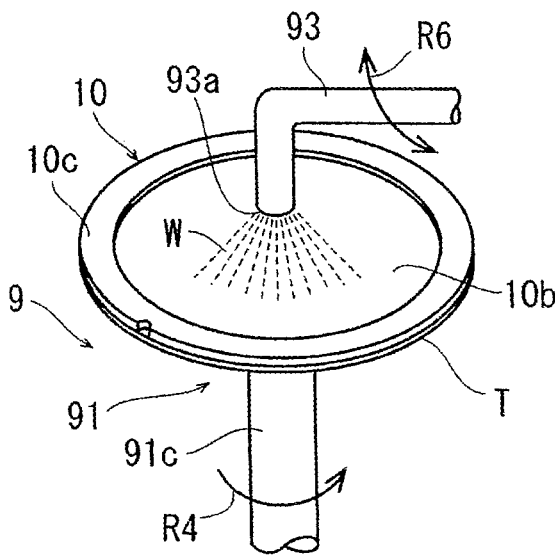

FIG.5A
FIG.5B
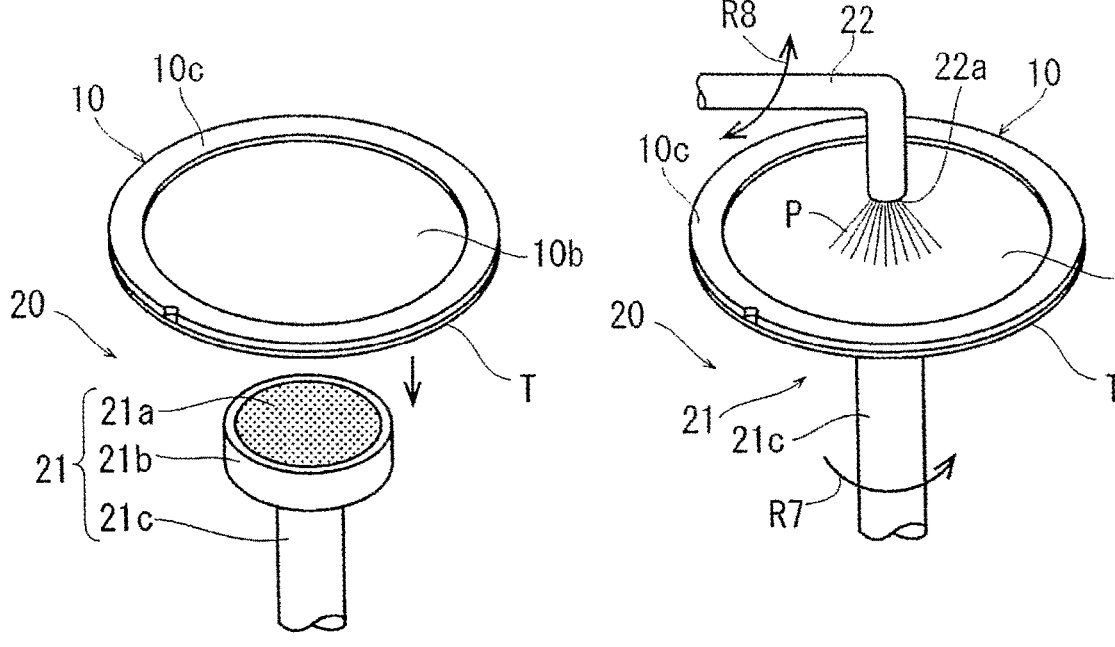
FIG.5C
FIG.5D
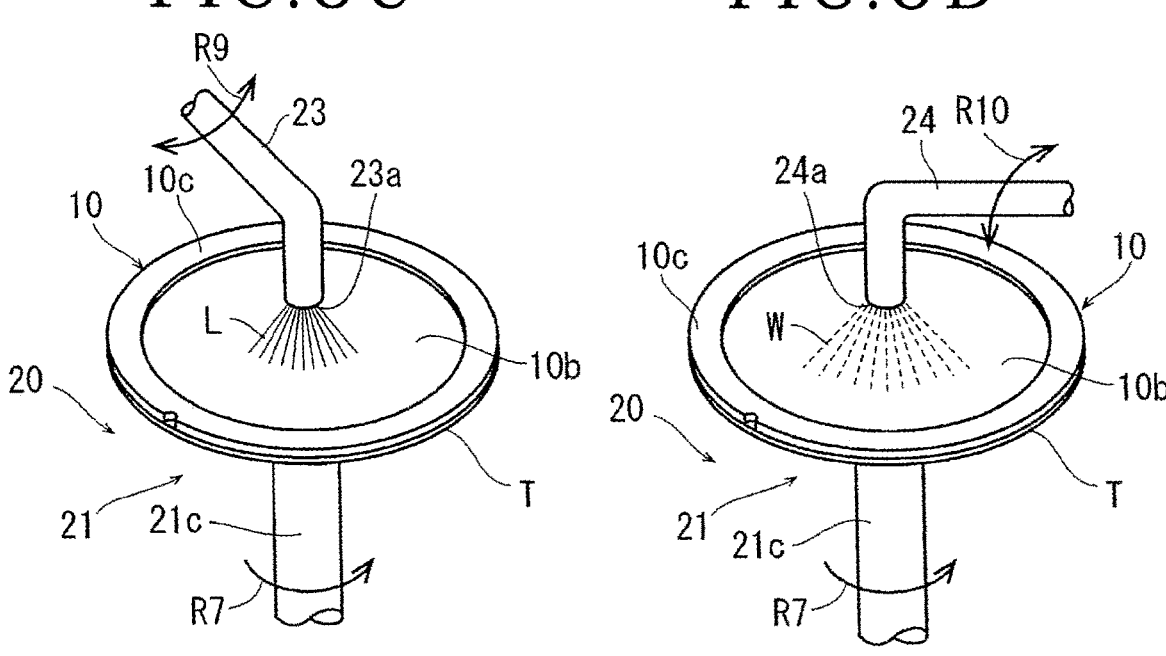

WAFER PROCESSING APPARATUS PROVIDING CLEANING AND ETCHING UNITS WITH SEPARATE SHROUDS AND ENCLOSING SEPARATE SPINNER TABLES

BACKGROUND OF THE INVENTION

Field of the Invention

The present invention relates to a wafer processing apparatus for processing a wafer.

Description of the Related Art

Wafers having a plurality of devices such as an integrated circuits (ICs), large-scale integration (LSI) circuits, etc. constructed in respective areas demarcated on their face sides by a grid of projected dicing lines are thinned down by having their reverse sides ground by a grinding apparatus, and then divided into individual device chips by a dicing apparatus. The device chips will be used in electric appliances such as cellular phones or personal computers.

When the reverse side of a wafer is thinned down by grinding, the wafer has its mechanical strength so reduced that difficulty tends to arise in delivering the wafer safely. In view of the difficulty, the present applicant has proposed a technology in which a radially inner region of a wafer is ground to thin the wafer, leaving an outer circumferential ring-shaped stiff portion on the wafer (see, for example, JP 2008-042081A).

The applicant has also proposed a technology in which a grinding strain is removed by an etching process from a ground surface of a wafer whose radially inner region has been ground, leaving an outer circumferential ring-shaped stiff portion on the wafer (see, for example, JP 2008-047695A).

SUMMARY OF THE INVENTION

Heretofore, it has been customary to grind a radially inner region of a wafer, leaving an outer circumferential ring-shaped stiff portion on the wafer, with a grinding apparatus disclosed in JP 2008-042081A, to store the ground wafer into a cassette, then to deliver the cassette to an etching apparatus disclosed in JP 2008-047695A, and to supply an etching liquid to the ground surface of the wafer taken out of the cassette, thereby removing a grinding strain from the ground surface of the wafer. However, the wafer may possibly run the risk of becoming damaged while it is being delivered between the grinding apparatus and the etching apparatus, and productivity is low because of a loss time occurring when the wafer moves between the grinding apparatus and the etching apparatus.

It is an object of the present invention to provide a wafer processing apparatus that prevents a wafer from suffering the risk of becoming damaged while being delivered between a grinding apparatus and an etching apparatus and that increases productivity by eliminating a loss time which would otherwise result from the movement of the wafer between the grinding apparatus and the etching apparatus.

In accordance with an aspect of the present invention, there is provided a wafer processing apparatus for processing a wafer, including a chuck table for holding the wafer thereon, a grinding unit having a rotatable grinding wheel with an annular array of grindstones mounted thereon for grinding a surface of the wafer held on the chuck table, a cleaning unit for cleaning the wafer that has been ground by the grinding unit, and an etching unit for removing a strain from the ground surface of the wafer, in which the grinding wheel of the grinding unit is smaller in diameter than the wafer, enabling the grindstones mounted on the grinding wheel to thin down an inner region of the wafer that includes the ground surface, leaving an outer circumferential ring-shaped stiff portion on the wafer, and the etching unit supplies an etching liquid to the inner region of the wafer inward of the outer circumferential ring-shaped stiff portion of the wafer to thereby remove a strain from the ground surface of the wafer.

Preferably, the cleaning unit includes a rotatable spinner table for holding the wafer under suction thereon and a cleaning water supply nozzle for supplying cleaning water to the ground surface of the wafer held on the spinner table, and the etching unit includes a rotatable spinner table for holding the wafer under suction thereon and an etching liquid supply nozzle for supplying the etching liquid to the ground surface of the wafer held on the spinner table. The etching unit and the cleaning unit may share a rotatable spinner table instead of the respective rotatable spinner tables.

According to the present invention, it is not necessary for the wafer processing apparatus to deliver a wafer to a separate etching apparatus for strain removal, and the wafer processing apparatus is effective to prevent the wafer from suffering the risk of becoming damaged while being delivered between different apparatuses, and to increase productivity by eliminating a loss time which would otherwise result from the movement of the wafer between the different apparatuses.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 4A is a perspective view illustrating the manner in which the wafer is placed onto a spinner table of a cleaning unit of the wafer processing apparatus;

FIG. 4B is a perspective view illustrating the manner in which the wafer is cleaned by the cleaning unit;

FIG. 4C is a perspective view illustrating the manner in which the wafer is dried by the cleaning unit;

FIG. 5A is a perspective view illustrating the manner in which the wafer is placed onto a spinner table of an etching unit of the wafer processing apparatus;

FIG. 5B is a perspective view illustrating the manner in which an etching process is performed on the wafer by the etching unit;

FIG. 5C is a perspective view illustrating the manner in which the wafer is cleaned by the etching unit; and FIG. 5D is a perspective view illustrating the manner in which the wafer is dried by the etching unit.

DETAILED DESCRIPTION OF THE PREFERRED EMBODIMENT

Figure 1:
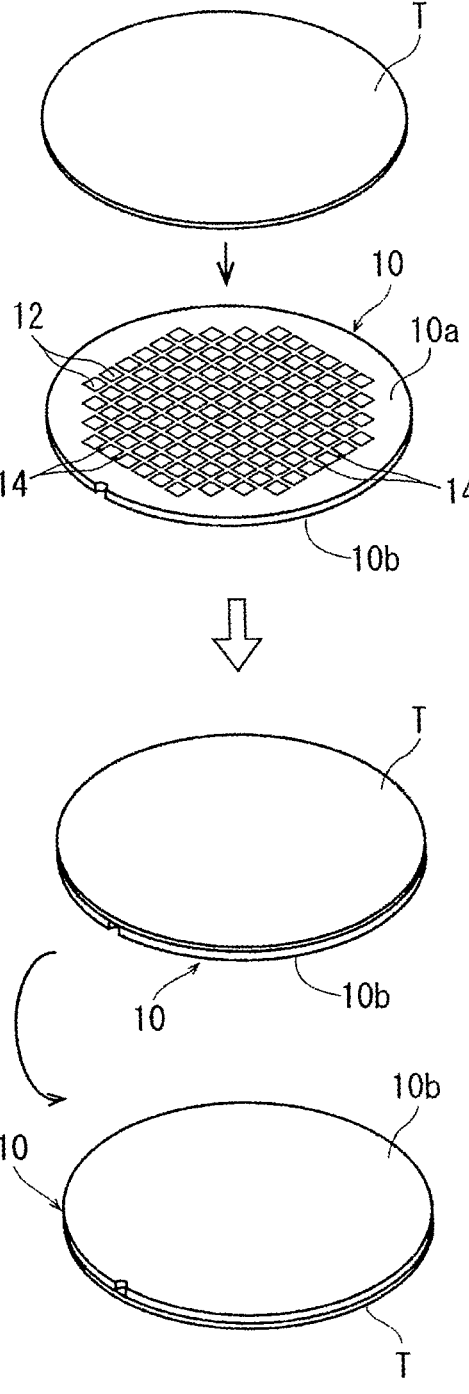
FIG. 1 is a perspective view of a wafer to be processed by a wafer processing apparatus according to a preferred embodiment of the present invention.

A wafer processing apparatus according to a preferred embodiment of the present invention will hereinafter be described in detail with reference to the accompanying drawings. FIG. 1 illustrates in perspective a wafer 10 to be processed by the wafer processing apparatus, denoted by 1 in FIG. 2, according to the present embodiment. As illustrated in FIG. 1, the wafer 10 represents a wafer of a semiconductor such as silicon, for example, having a plurality of devices 12 constructed in respective areas demarcated on its face side 10a by a grid of projected dicing lines 14. In preparation for being processed by the wafer processing apparatus 1, a protective tape T is affixed to the face side 10a of the wafer 10, and the wafer 10 integral with the affixed protective tape T is overturned as illustrated in a lower part of FIG. 1. Then, a reverse side 10b, opposite the face side 10a, of the wafer 10 is processed by the wafer processing apparatus 1.

Figure 2:
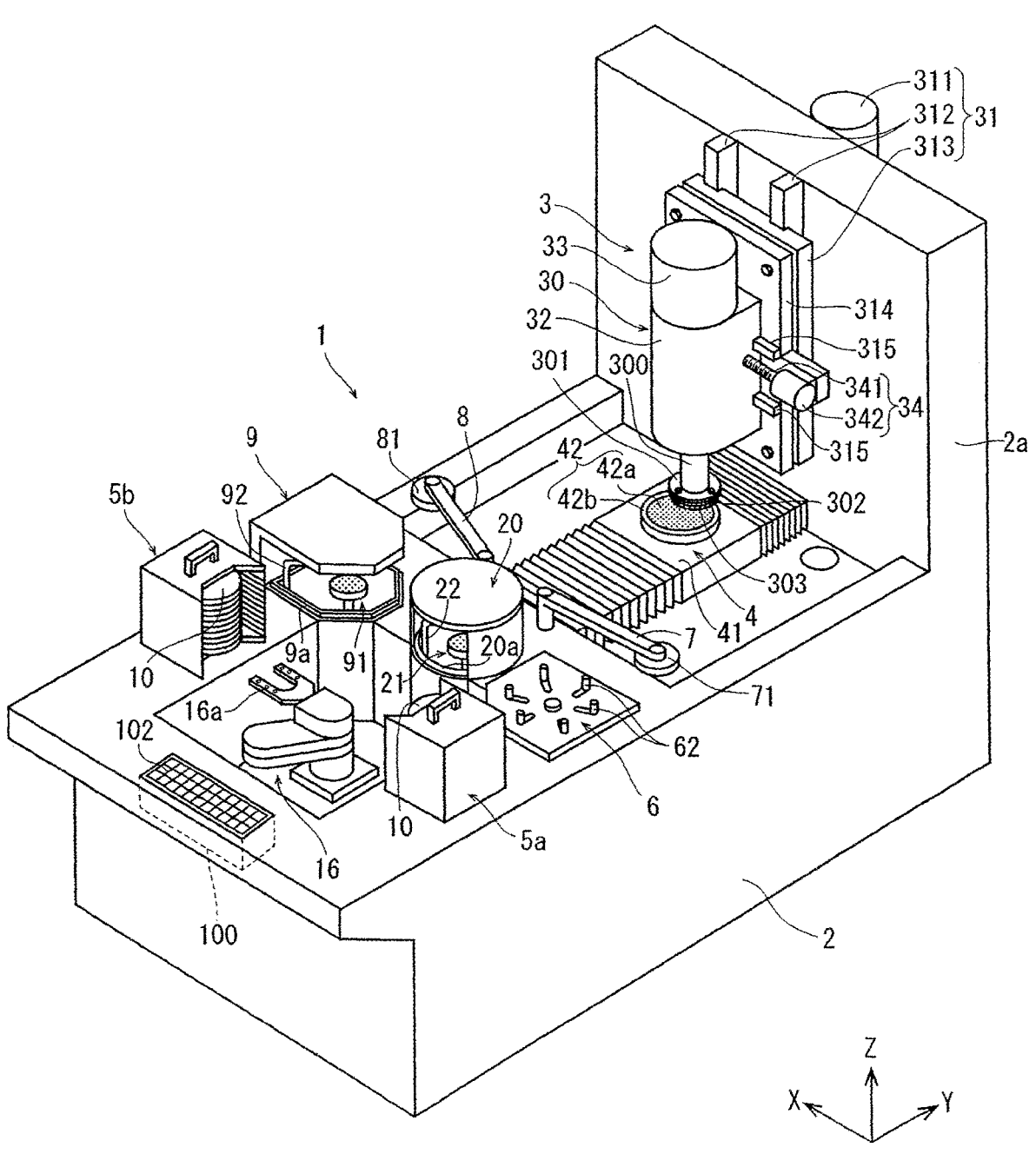
FIG. 2 is a perspective view of the wafer processing apparatus.

FIG. 2 illustrates in perspective the wafer processing apparatus 1 for processing the wafer 10. The wafer processing apparatus 1 is illustrated in reference to a three-dimensional XYZ coordinate system having an X-axis represented by an arrow X, a Y-axis represented by an arrow Y, and a Z-axis represented by an arrow Z in FIG. 2. The X-axis and the Y-axis extend horizontally and perpendicularly to each other, and the Z-axis extends vertically and perpendicularly to the X-axis and the Y-axis.

As illustrated in FIG. 2, the wafer processing apparatus 1 includes an apparatus housing 2 shaped substantially as a rectangular parallelepiped that supports a holding unit 4 for holding the wafer 10 thereon, a grinding unit 3 for grinding the wafer 10 held on the holding unit 4, a cleaning unit 9 for cleaning the wafer 10 that has been ground by the grinding unit 3, and an etching unit 20 for removing a strain from the ground surface of the wafer 10 by way of etching.

The wafer processing apparatus 1 further includes a first cassette 5a disposed on a front end portion of the apparatus housing 2 on one side along the X-axis, for housing wafers 10 to be processed, a second cassette 5b disposed on the end portion of the apparatus housing 2 on the other side along the X-axis, for housing wafers 10 that have been processed, and a temporary rest unit 6 mounted on the apparatus housing 2 at a position adjacent to the first cassette 5a along the Y-axis, for centering a wafer 10 disposed thereon. The cleaning unit 9 is mounted on the apparatus housing 2 at a position adjacent to the second cassette 5b along the Y-axis. The etching unit 20 is mounted on the apparatus housing 2 at a position adjacent to the cleaning unit 9 along the X-axis and positioned between the cleaning unit 9 and the temporary rest unit 6.

In addition, the wafer processing apparatus 1 includes a first delivery mechanism 16 including a hand 16a for delivering a wafer 10 stored in the first cassette 5a from the first cassette 5a to the temporary rest unit 6, delivering a wafer 10 that has been cleaned by the cleaning unit 9 from the cleaning unit 9 to the etching unit 20, and delivering a wafer 10 from which the etching unit 20 has removed a strain in its ground surface from the etching unit 20 to the second cassette 5b, a second delivery mechanism 7 for delivering a wafer 10 that has been placed on the temporary rest unit 6 and centered by a plurality of pins 62 thereof from the temporary rest unit 6 to a chuck table 42 of the holding unit 4 that has been placed in an unloading/loading position, close to the second delivery mechanism 7, by a Y-axis feed mechanism, not illustrated, a third delivery mechanism 8 for delivering a wafer 10 that has been ground from the chuck table 42 in the unloading/loading position to the cleaning unit 9, and a controller 100 having a control panel 102. The cleaning unit 9 includes a spinner table 91 for holding a ground wafer 10 under suction thereon and rotating the wafer 10 about its central axis and a cleaning water supply nozzle 92 for supplying cleaning water to the ground surface of the wafer 10 held on the spinner table 91. The etching unit 20 includes a spinner table 21 for holding a ground wafer 10 under suction thereon and rotating the wafer 10 about its central axis and an etching liquid supply nozzle 22 for supplying an etching liquid to the ground surface of the wafer 10 held on the spinner table 21.

The grinding unit 3 is vertically movably mounted on a pair of guide rails 312 extending vertically along the Z-axis on an inner surface of a support wall 2a that is erected on a rear end of the apparatus housing 2. The grinding unit 3 includes a spindle unit 30 having a spindle 300 rotatably supported in a spindle housing 32 for rotation about a vertical central axis thereof, a grinding wheel 302 mounted on the lower end of the spindle 300 by a grinding wheel 302, a plurality of grindstones 303 disposed in an annular array on the lower end of the wheel mount 301, and an electric motor 33 for rotating the spindle 300 about the vertical central axis thereof, and a grinding feed mechanism 31 for vertically moving the spindle unit 30 along the Z-axis. The grinding wheel 302 is smaller in diameter than a wafer 10 to be ground thereby in order to grind and hence thin down a central area of the reverse side 10b of the wafer 10, leaving an outer circumferential ring-shaped stiff portion on the wafer 10.

The grinding feed mechanism 31 includes a ball screw, not illustrated, extending vertically along the Z-axis and disposed on a rear surface of the support wall 2a, a stepping motor 311 coupled to the upper end of the ball screw, a pair of guide rails 312 extending vertically along the Z-axis and disposed on a front surface of the support wall 2a, and a vertically movable plate 313 slidably mounted on the guide rails 312 and having a nut, not illustrated, coupled at a rear surface thereof and operatively threaded over the ball screw. The spindle housing 32 is movably mounted on a pair of guide rails 315 extending along the X-axis on a front surface of a joint plate 314 mounted on the vertically movable plate 313. The spindle housing 32 is movable along the guide rails 315 by an X-axis feed mechanism 34. The X-axis feed mechanism 34 includes a ball screw 341 extending along the X-axis and a stepping motor 342 for rotating the ball screw 341 about its central axis. The ball screw 341 is operatively threaded through a nut, not illustrated, in the spindle housing 32. When the stepping motor 342 is energized, it rotates the ball screw 341 about its central axis, causing the nut to move the spindle unit 30 to a desired position along the X-axis.

The chuck table 42 of the holding unit 4 is disposed on and protrudes upwardly from a cover table 41 on the apparatus housing 2 and is rotatable about its vertical central axis by a rotating mechanism, not illustrated. The chuck table 42 includes a suction chuck 42a made of an air permeable material and a frame 42b surrounding the peripheral edge of the suction chuck 42a. The frame 42b is fluidly connected to suction means, not illustrated. When the suction means is actuated, it generates and transmits a negative pressure through the frame 42b to the suction chuck 42a, holding a wafer 10 under suction on its upper surface.

The controller 100 includes a computer and includes a central processing unit (CPU) for performing processing sequences according to control programs, a read only memory (ROM) storing the control programs, etc., a read/write random access memory (RAM) for temporarily storing detected values and processed results, an input interface, and an output interface. Details of the controller 100 are omitted from illustration. The operable components referred to above of the wafer processing apparatus 1 are electrically connected to the controller 100. The operator enters commands through the control panel 102 to the controller 100, which controls the operable components as described later.

The wafer processing apparatus 1 according to the present embodiment is basically constructed as described above. The functions and operations of the wafer processing apparatus 1 will be described in specific detail below.

Figures 3A, 3B:
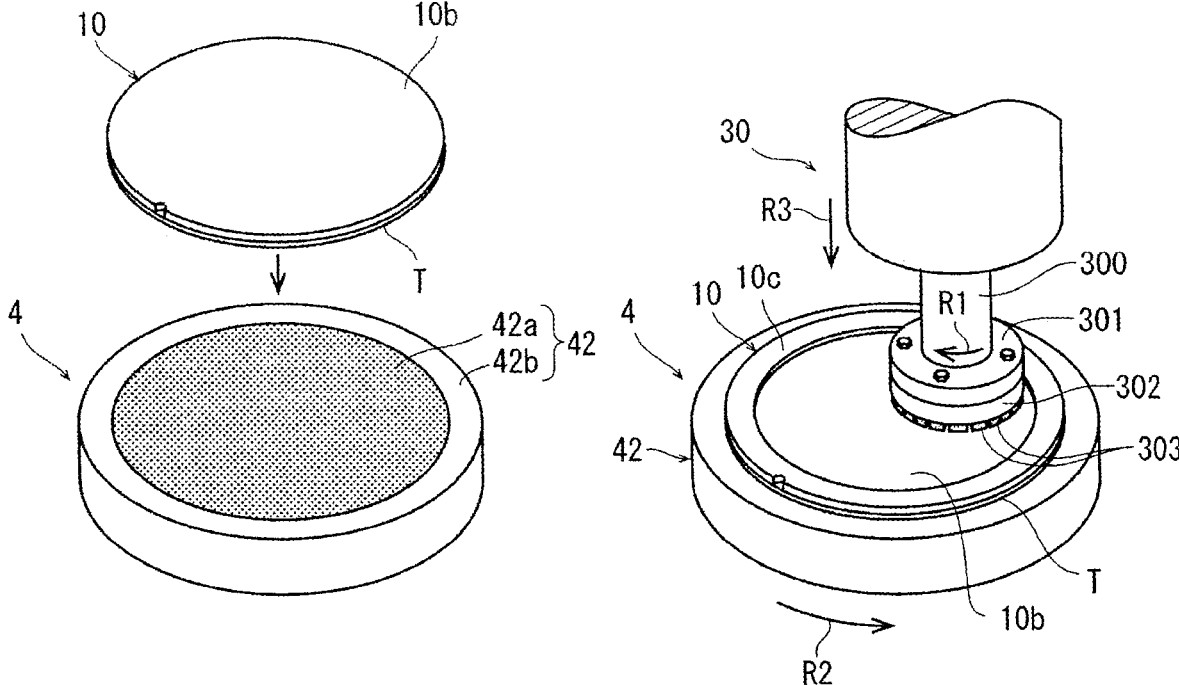
FIG. 3A is a perspective view illustrating the manner in which a wafer is placed onto a holding unit of the wafer processing apparatus.
FIG. 3B is a perspective view illustrating the manner in which a grinding process is performed on the wafer by a grinding unit of the wafer processing apparatus.

The wafer processing apparatus 1 performs a processing process for grinding and hence thinning down a central area of the reverse side 10b of the wafer 10 illustrated in FIG. 1, leaving an outer circumferential ring-shaped stiff portion 10c (see FIG. 3B) on the wafer 10. For performing the processing process on the wafer 10, the first delivery mechanism 16 is actuated to unload a wafer 10 to be processed from the first cassette 5a and deliver the wafer 10 to the temporary rest unit 6, where the wafer 10 is centered. Then, the second delivery mechanism 7 actuates a holder 71 thereof to attract under suction the wafer 10 held on the temporary rest unit 6, delivers the attracted wafer 10 to the chuck table 42 in the unloading/loading position, and places the wafer 10 onto the chuck table 42 such that the protective tape T affixed to the face side 10a faces downwardly and the reverse side 10b faces upwardly, as illustrated in FIG. 3A. After the wafer 10 has been placed on the chuck table 42, the suction means referred to above is actuated to hold the wafer 10 under suction on the chuck table 42.

When the wafer 10 has been held under suction on the chuck table 42, the Y-axis feed mechanism is actuated to position the chuck table 42 in a grinding position below the spindle unit 30, and the X-axis feed mechanism 34 is actuated to position the spindle unit 30 in a desired position along the X-axis. Then, the electric motor 33 of the grinding unit 3 is energized to rotate the spindle 300 about its vertical central axis in the direction indicated by an arrow R1 at a predetermined speed, e.g., 3000 rpm, and the rotating mechanism associated with the chuck table 42 is energized to rotate the chuck table 42 about its vertical central axis in the direction indicated by an arrow R2 at a predetermined speed, e.g., 300 rpm. Then, the grinding feed mechanism 31 is actuated to lower the spindle unit 30 in the direction indicated by an arrow R3, bringing the grindstones 303 on the grinding wheel 302 into contact with an inner region of the reverse side 10b of the wafer 10 that corresponds to the region where the devices 12 are constructed on the face side 10a while at the same time a grinding water supply mechanism, not illustrated, is supplying grinding water to the reverse side 10b of the wafer 10.

Then, the grinding feed mechanism 31 grinding-feeds, i.e., lowers, the grindstones 303 at a predetermined speed, i.e., 1.0 μm/s, in abrasive contact with the wafer 10, grinding the wafer 10 until the wafer reaches a desired thickness. At this time, the thickness of the wafer 10 may be measured by an appropriate thickness measuring instrument, not illustrated, while the wafer 10 is being ground. As described above, the grinding wheel 302 is smaller in diameter than the wafer 10. The grinding wheel 302 is kept in contact with a center of the wafer 10 at all times. As illustrated in FIG. 3B, only the inner region, which corresponds to the region where the devices 12 are constructed on the face side 10a, of the reverse side 10b of the wafer 10 is thinned down, leaving the outer circumferential ring-shaped stiff portion 10c on the wafer 10.

The grinding unit 3 grinds the wafer 10 until the inner region of the reverse side 10b of the wafer 10 is thinned down to the desired thickness, leaving the outer circumferential ring-shaped stiff portion 10c on the wafer 10. Then, the grinding unit 3 is shut down, and the chuck table 42 is moved to the unloading/loading position. The third delivery mechanism 8 actuates a holder 81 thereof to attract under suction the wafer 10 held on the chuck table 42 in the unloading/loading position, delivers the wafer 10 to the spinner table 91 of the cleaning unit 9, and places the wafer 10 onto the spinner table 91 with the protective tape T facing downwardly. As illustrated in FIG. 4A, the spinner table 91 includes a suction chuck 91a made of an air permeable material, a frame 91b surrounding the peripheral edge of the suction chuck 91a, a rotational shaft 91c coupled to the frame 91b, an electric motor, not illustrated, for rotating the rotational shaft 91c about its vertical central axis, and suction means, not illustrated, for generating and transmitting a negative pressure to the suction chuck 91a. When the suction means is actuated, it generates and transmits a negative pressure through the frame 91b to the suction chuck 91a, holding the wafer 10 under suction on its upper surface.

When the wafer 10 has been held under suction on the spinner table 91, the electric motor of the spinner table 91 is energized to rotate the spinner table 91 about its vertical central axis in the direction indicated by an arrow R4 at a predetermined speed, e.g., 300 rpm, and the cleaning water supply nozzle 92 has its nozzle tip 92a positioned above the wafer 10 on the spinner table 91. While the cleaning water supply nozzle 92 is swinging in the directions indicated by an arrow R5, the cleaning water supply nozzle 92 supplies cleaning water L to the reverse side 10b of the wafer 10, removing grinding water, swarf, etc. remaining on the reverse side 10b of the wafer 10. The cleaning unit 9 is continuously actuated for a predetermined period of time until the reverse side 10b of the wafer 10 is cleaned. Then, the cleaning water supply nozzle 92 stops supplying the cleaning water L, and is retracted to a standby position outside of the spinner table 91. Then, the spinner table 91 continues to rotate, expelling away the cleaning water L remaining on the spinner table 91 under centrifugal forces.

When necessary, an air nozzle 93 (see FIG. 4C) included in the cleaning unit 9 is actuated to position its nozzle tip 93a above the reverse side 10b of the wafer 10 and then eject high-pressure air W to the reverse side 10b of the wafer 10 while swinging in the direction indicated by an arrow R6, expelling away the cleaning water L and swarf remaining on the reverse side 10b of the wafer 10 and drying the wafer 10. When the wafer 10 is thus dried, the spinner table 91 should preferably be rotated at a higher speed, e.g., 3000 rpm. When the cleaning unit 9 cleans and dries the wafer 10, a shutter 9a that is illustrated retracted downwardly in FIG. 2 is elevated to enclose the spinner table 91 in a sealed cleaning space, thereby preventing the cleaning water L and the air W from leaking out of the cleaning unit 9.

The inner region of the reverse side 10b of the wafer 10 that has been ground and thinned down contains a grinding strain caused by the grinding process. The wafer processing apparatus 1 according to the present embodiment carries out an etching process for removing such a grinding strain from the ground and thinned-down inner region of the reverse side 10b. The etching process will be described below.

The wafer 10 that has been cleaned by the cleaning unit 9 is attracted under suction by the hand 16a of the first delivery mechanism 16 and delivered from the cleaning unit 9 to the etching unit 20, where the wafer 10 is placed onto the spinner table 21, as illustrated in FIG. 5A. The spinner table 21 includes a suction chuck 21a made of an air permeable material and a frame 21b surrounding the peripheral edge of the suction chuck 21a, a rotational shaft 21c coupled to the frame 21b, an electric motor, not illustrated, for rotating the rotational shaft 21c about its vertical central axis, and suction means, not illustrated, for generating and transmitting a negative pressure to the suction chuck 21a. When the suction means is actuated, it generates and transmits a negative pressure through the frame 21b to the suction chuck 21a, holding the wafer 10 under suction on its upper surface.

When the wafer 10 has been placed on and held under suction on the spinner table 21, as illustrated in FIG. 5B, the electric motor associated with the spinner table 21 is energized to rotate the spinner table 21 about its vertical central axis in the direction indicated by an arrow R7 at a predetermined speed, e.g., 100 rpm, and the etching liquid supply nozzle 22 has its nozzle tip 22a positioned above the wafer 10 on the spinner table 91. Then, while the etching liquid supply nozzle 22 is swinging in the directions indicated by an arrow R8, the etching liquid supply nozzle 22 supplies an etching liquid P to the reverse side 10b of the wafer 10 for a predetermined period of time, e.g., 60 seconds. The etching liquid P may be a mixed acid liquid that is a mixture of hydrofluoric acid and nitric acid, a tetramethylammonium hydroxide (TMAH) liquid, or the like, for example.

When the etching liquid supply nozzle 22 has supplied the etching liquid P to the ground surface of the reverse side 10b of the wafer 10 for the predetermined period of time, the etching liquid supply nozzle 22 stops supplying the etching liquid P, and is retracted to a standby position outside of the spinner table 21. Then, as illustrated in FIG. 5C, a cleaning water supply nozzle 23 has its nozzle tip 23a positioned above the wafer 10 on the spinner table 21. Then, while the cleaning water supply nozzle 23 is swinging in the directions indicated by an arrow R9, the cleaning water supply nozzle 23 supplies cleaning water L to the reverse side 10b of the wafer 10 for a predetermined period of time, removing the etching liquid P remaining on the reverse side 10b. At this time, the spinner table 21 rotates at an increased speed, e.g., 300 rpm. When the cleaning water supply nozzle 23 has operated for the predetermined period of time, removing the etching liquid P from the reverse side 10b of the wafer 10, the cleaning water supply nozzle 23 stops supplying cleaning water L, and is retracted to a standby position outside of the spinner table 21.

After the cleaning water L has been supplied from the cleaning water supply nozzle 23, the spinner table 21 continues to rotate about its vertical central axis to remove the cleaning water L remaining on the reverse side 10b of the wafer 10 under centrifugal forces. When necessary, an air nozzle 24 (see FIG. 5D) included in the etching unit 20 is actuated to position its nozzle tip 24a above the reverse side 10b of the wafer 10 and then eject high-pressure air W to the reverse side 10b of the wafer 10 while swinging in the direction indicated by an arrow R10, expelling away the cleaning water L remaining on the reverse side 10b of the wafer 10 and drying the wafer 10. When the wafer 10 is thus dried, the spinner table 21 should preferably be rotated at a higher speed, e.g., 3000 rpm. When the etching unit 20 supplies the etching liquid P, cleans the wafer 10 with the cleaning water L, and dries the wafer 10 with the air W, a shutter 20a that is illustrated retracted downwardly in FIG. 2 is elevated to enclose the spinner table 21 in a sealed cleaning space, thereby preventing the etching liquid P, the cleaning water L, and the air W from leaking out of the etching unit 20.

When the grinding strain has been removed from the wafer 10 by the etching unit 20 that has supplied the etching liquid P to the ground surface of the reverse side 10b of the wafer 10, the wafer 10 placed on the spinner table 21 is attracted under suction by the hand 16a of the first delivery mechanism 16 and delivered from the etching unit 20 to the second cassette 5b, where the processed wafer 10 is stored at a predetermined position therein. The processing of the wafer 10 by the wafer processing apparatus 1 is now completed.

As described above, the wafer processing apparatus 1 according to the present embodiment grinds the inner region of the reverse side 10b of the wafer 10 that corresponds to the region where the devices 12 are constructed on the face side 10a, leaving the outer circumferential ring-shaped stiff portion 10c on the wafer 10. The etching unit 20 included in the wafer processing apparatus 1 then supplies the etching liquid P to the ground surface of the reverse side 10b radially inward of the outer circumferential ring-shaped stiff portion 10c, removing the strain from the ground surface of the reverse side 10b. Consequently, since it is not necessary for the wafer processing apparatus 1 to deliver the wafer 10 to a separate etching apparatus for strain removal, the wafer processing apparatus 1 is effective to prevent the wafer 10 from suffering the risk of becoming damaged while being delivered between different apparatuses, and to increase productivity by eliminating a loss time which would otherwise result from the movement of the wafer between the different apparatuses.

According to the illustrated embodiment, the wafer processing apparatus 1 includes the etching unit 20 positioned adjacent to the cleaning unit 9, and after the cleaning unit 9 has cleaned the wafer 10, the first delivery mechanism 16 delivers the wafer 10 from the cleaning unit 9 to the etching unit 20 where the etching process is performed on the wafer 10. However, the present invention is not limited to such details. The cleaning unit 9 and the etching unit 20 may be combined into an integral structure where a spinner table is shared and the etching liquid supply nozzle 22 is added to the cleaning unit 9, enabling the cleaning unit 9 to perform the function of the etching unit 20. According to such a modification, the cleaning water supply nozzle and the air nozzle are also shared, and the wafer 10 does not need to be unloaded from the spinner table 91 of the cleaning unit 9. After the grinding process, the cleaning process and the etching process can be successively carried out in the integral assembly, and there is no need to deliver the wafer 10 from the cleaning unit 9 to the etching unit 20 that would otherwise be separate from each other, so that the wafer 10 can be processed more efficiently. However, the cleaning unit 9 and the etching unit 20 that are separately included in the wafer processing apparatus 1 according to the illustrated embodiment are advantageous in that no swarf is carried into the space where the etching process is carried out, and hence the space where the etching process is carried out is kept clean, thereby preventing the wafer 10 from being unduly contaminated, and that waste liquids including the cleaning water L containing swarf and the etching liquid P used in the etching process can separately be treated.

Furthermore, according to the illustrated embodiment, the etching unit 20 includes the etching liquid supply nozzle 22, the cleaning water supply nozzle 23, and the air nozzle 24 that supply the etching liquid P, the cleaning water L, and eject the air W, respectively. However, a single nozzle may be shared to selectively supply the etching liquid P, the cleaning water L, and the air W in the etching process.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing apparatus for processing a wafer, comprising:

a chuck table for holding the wafer thereon;

a grinding unit having a rotatable grinding wheel with an annular array of grindstones mounted thereon for grinding a surface of the wafer held on the chuck table;

a cleaning unit for cleaning the wafer that has been ground by the grinding unit; and an etching unit for removing a strain from the ground surface of the wafer, wherein:

the grinding wheel of the grinding unit is smaller in diameter than the wafer, enabling the grindstones mounted on the grinding wheel to thin down an inner region of the wafer that includes the ground surface, leaving an outer circumferential ring-shaped stiff portion on the wafer, the etching unit supplies an etching liquid to the inner region of the wafer inward of the outer circumferential ring-shaped stiff portion of the wafer to thereby remove a strain from the ground surface of the wafer, the grinding unit, the cleaning unit, and the etching unit are housed in a single apparatus and are configured such that the wafer is transferred directly from the grinding unit to the cleaning unit and then to the etching unit without being stored in a cassette or transferred to a separate apparatus, and both the cleaning unit and the etching unit include separate shrouds which are configured to enclose separate spinner tables during respective liquid processing.

2. The wafer processing apparatus according to claim 1, wherein the cleaning unit includes a rotatable spinner table for holding the wafer under suction thereon and a cleaning water supply nozzle for supplying cleaning water to the ground surface of the wafer held on the spinner table, and the etching unit includes a rotatable spinner table for holding the wafer under suction thereon and an etching liquid supply nozzle for supplying the etching liquid to the ground surface of the wafer held on the spinner table.

3. The wafer processing apparatus according to claim 1, wherein the cleaning unit is positioned between the grinding unit and the etching unit within a housing of the single apparatus.

4. The wafer processing apparatus according to claim 1, wherein the wafer is transferred from the grinding unit to the cleaning unit and from the cleaning unit to the etching unit by first and second delivery mechanisms, respectively, which operate entirely within a housing of the single apparatus.

5. The wafer processing apparatus according to claim 1, wherein the etching unit supplies the etching liquid while the wafer is rotated on a spinner table.

6. The wafer processing apparatus according to claim 5, wherein the etching liquid is supplied to the wafer while the outer circumferential ring-shaped stiff portion remains unetched.

7. The wafer processing apparatus according to claim 1, wherein the cleaning unit cleans the wafer after grinding and before etching to remove grinding swarf from the ground surface.

8. The wafer processing apparatus according to claim 1, wherein each of the shrouds define a sealed processing space around the respective spinner tables during liquid supply and centrifugal removal of liquid.

9. The wafer processing apparatus according to claim 1, wherein the wafer is transferred between the grinding unit, the cleaning unit, and the etching unit while remaining within an apparatus housing of the single apparatus.

* * * * *